United States Patent [19]

Igarashi et al.

[11] Patent Number: 5,940,143
[45] Date of Patent: Aug. 17, 1999

[54] HIGH-DEFINITION TELEVISION SIGNAL RECEIVING APPARATUS AND GAIN CONTROL CIRCUIT THEREOF

[75] Inventors: Yutaka Igarashi, Kamakura; Hiroyuki Mizukami; Toshio Nagashima, both of Yokohama, all of Japan

[73] Assignee: Hitachi, Ltd., Tokyo, Japan

[21] Appl. No.: 08/725,466

[22] Filed: Oct. 4, 1996

[30] Foreign Application Priority Data

Oct. 6, 1995 [JP] Japan ..................................... 7-260199

[51] Int. Cl.[6] ...................................................... H04B 1/26
[52] U.S. Cl. ...................... 348/678; 455/241.1; 455/246;
455/251; 455/78; 455/183.1; 455/200.1;
455/246.1; 455/249.1; 455/250.1; 455/254;
348/707; 348/678; 348/723
[58] Field of Search ..................................... 348/678, 685,
348/707, 735, 647, 255; 455/234.1, 234.2,
236.1, 245.1, 250.1, 219, 232.1, 235.1,
240.1, 241.1, 247.1, 251.1

[56] References Cited

U.S. PATENT DOCUMENTS

| | | | |
|---|---|---|---|
| 4,535,361 | 8/1985 | Corbel | 348/678 |
| 4,872,206 | 10/1989 | Grazaidie et al. | 455/241.1 |
| 5,428,824 | 6/1995 | Kasai | 455/246.1 |
| 5,603,114 | 2/1997 | Tomita | 455/250.1 |

*Primary Examiner*—Andrew I. Faile
*Assistant Examiner*—Ibrahim Mohamednur
*Attorney, Agent, or Firm*—Antonelli, Terry, Stout & Kraus, LLP

[57] ABSTRACT

An automatic gain controlling circuit and a high-definition television signal receiving apparatus includes an input terminal for receiving a signal including first and second signal components creating interference, a first automatic gain controlling amplifier for amplifying the received signal and providing an amplified output signal, a filter for selectively passing a signal portion in a predetermined band of the amplified output signal from the first automatic gain controlling amplifier, and a second automatic gain controlling amplifier for amplifying the signal portion passed by said filter and providing amplified output signal portion. There is also provided a switching signal generator responsive to one of the amplified output signal and the amplifier output signal portion for generating a switching signal, a switching circuit at least being responsive to the switching signal for at least controlling supply of a gain control signal to the first and second automatic gain controlling amplifiers in accordance therewith, and an automatic gain control signal detector for detecting the amplified output signal for supplying an output indicative thereof to the switching circuit.

20 Claims, 4 Drawing Sheets

HIGH-DEFINITION TELEVISION SIGNAL RECEIVING APPARATUS AND GAIN CONTROL CIRCUIT THEREOF

BACKGROUND OF THE INVENTION

The present invention relates to a high-definition television signal receiving apparatus and an automatic gain controlling apparatus thereof for use in a circuit that extracts for processing only a desired signal from a sum signal of two or more signals having different frequency-division-multiplexed levels. More particularly, the present invention relates to a high-definition television signal receiving apparatus having a capability of suppressing interference between channels caused when broadcasts having different signal levels such as a high-definition television signal and a standard television signal are transmitted simultaneously.

Recently, multi-channel broadcasting has increased along with an increase of television broadcasting and CATV broadcasting. For the purpose of supporting multi-channel broadcasting, receiving apparatuses having a double conversion tuner have been used for reducing a deviation in in-band flatness (tilt), image suppression, and interference caused by leakage of locally oscillated signals also at the time of multi-channel reception.

FIG. 4 shows a conventional television receiver adopting a double conversion tuner. As shown in FIG. 4, a signal supplied from a television signal input terminal 10 is processed by an input filter 20 such as a band pass filter (BPF), a first automatic gain controlling amplifier 30, a first mixer 40, a first IF (intermediate frequency) filter 50 such as a band pass filter, a first IF (intermediate frequency) amplifier 60, a second mixer 70, a second IF amplifier 80, a second IF filter 90 such as a surface acoustic wave (SAW), and a second automatic gain controlling amplifier 100 in this order to be outputted from an output terminal 110. The first mixer 40 is connected with a first local oscillator 120. The first local oscillator 120 is connected with a reference oscillator 140 via a PLL (Phase Locked Loop) circuit 130. The second mixer 70 is connected with a second local oscillator 150. The output signal of the second automatic gain controlling amplifier 100 is branched to be supplied to an AGC detector 200. The AGC detector 200 is connected with an AGC signal switching circuit 190. The AGC signal switching circuit 190 is also connected with a reference voltage circuit 210. An output of the AGC signal switching circuit 190 is supplied to the first automatic gain controlling amplifier 30 and the second automatic gain controlling amplifier 100. An input signal from a tuning signal input terminal 230 is supplied to a controller 220. An output of the controller 220 is supplied to the PLL circuit 130 and the input filter 20.

In operation, an RF (Radio Frequency) signal AM-modulated with the standard television signal is supplied to the input terminal 10 and a band of the supplied signal is divided by the input filter 20. Only the channel containing a desired channel is selectively supplied to the first automatic gain control amplifier 30. Meanwhile, a tuning signal is supplied to the tuning signal input terminal 230. The input filter 20 is controlled by the controller 220 such that an appropriate pass band is selected according to a channel to be tuned in. The first automatic gain control amplifier 30 amplifies or attenuates the signal band-limited by the input filter 20 to an appropriate receive level and supplies an output of a resultant signal to the first mixer 40.

The first local oscillator 120 is controlled by the controller 220 and the PLL circuit 130 so that oscillation is performed at a frequency corresponding to the desired channel by the tuning signal supplied from the tuning signal input terminal 230. The PLL circuit 130 compares a signal obtained by dividing an oscillation frequency having a stable frequency from the reference oscillator 140 with a signal obtained by dividing an oscillation frequency from the first local oscillator 120 to control the oscillation frequency of the first local oscillator so that an error becomes zero. Appropriately varying these dividing ratios by the controller 220 allows the first local oscillator 120 to oscillate at a frequency corresponding to the desired channel.

The first mixer 40 mixes a signal from the first automatic gain control amplifier 30 and a locally oscillated signal from the first local oscillator 120 to output the first IF (intermediate frequency) signal 41. The first IF filter 50 selectively passes only the desired channel of the first IF signal 41. The first IF amplifier 60 amplifies the passed signal and supplies the amplified signal to the second mixer 70. The second mixer mixes the signal from the first IF amplifier 60 and the locally oscillated signal from the second local oscillator 150 to output the second IF signal 71. The second IF amplifier 80 amplifies this mixed signal and supplies the amplified signal to the second IF filter 90. The second IF filter 90 selectively passes only the desired channel of the second IF signal 71. The second IF signal 71 that passed the second IF filter is amplified by the second automatic gain controlling amplifier 100 to be outputted from the output terminal 110.

A gain control signal for controlling gains of the first automatic gain control amplifier 30 and the second automatic gain controlling amplifier 100 is generated by detecting through the AGC detector 200 a signal level obtained by branching the output signal of the second automatic gain controlling amplifier 100. The AGC signal switching or selector circuit 190 applies the generated gain controlling signal to either the first automatic gain controlling amplifier 30 or the second automatic gain controlling amplifier 100.

Namely, the output signal of the second automatic gain controlling amplifier is detected by the AGC detector 200 to provide the gain control signal. The AGC signal switching circuit 190, if the output signal became larger than the previous signal, first applies this signal to the second automatic gain controlling amplifier 100. Also after the gain attenuation of the second automatic gain controlling amplifier 100 reached the maximum level, the AGC signal switching circuit 190 applies the gain control signal to the first automatic gain control amplifier 30. Whether the gain attenuation of the second automatic gain controlling amplifier 100 has reached the maximum level or not is detected by comparing the output of the AGC detector 200 with the output of the reference voltage 210.

When the level of the output signal of the second automatic gain controlling amplifier 100 goes down, the AGC signal switching circuit 190 applies the gain control signal to the first automatic gain control amplifier 30 to increase the gain of the first automatic gain control amplifier 30. If the signal level is small after the gain of the first automatic gain control amplifier 30 has reached the maximum level, the AGC signal switching circuit 190 applies the gain control signal to the second automatic gain controlling amplifier 100 to increase the gain of the second automatic gain controlling amplifier 100. Whether the gain of the first automatic gain control amplifier 30 has reached the maximum level or not is detected by comparing the output of the AGC detector 200 with the output of the reference voltage 210.

Thus, if it is necessary to decrease the gain of the first automatic gain control amplifier 30 or the gain of the second automatic gain control 100 in order to keep constant the signal level outputted from the output terminal 110, the gain of the second automatic gain controlling amplifier 100 in the rear stage of the receiving apparatus is initially decreased as far as possible. If this is not sufficient, the gain of the first automatic gain control amplifier 30 in the front stage is decreased to keep the gain of the first automatic gain control amplifier 30 in the front stage as large as possible. Consequently, the degradation of the noise factor of the entire receiving apparatus can be suppressed.

Generally, in order to maintain a value of the noise figure of the system small, it is necessary to keep the gain of a first automatic gain controlling amplifier in front stage larger than a second automatic gain controlling amplifier in the rear stage. In the case of reducing of the gain of the first automatic gain controlling amplifier in the front stage and the second automatic gain controlling amplifier in the rear stage, first the gain of the second automatic gain controlling amplifier is reduced, and when the gain attenuation of the second automatic gain controlling amplifier reaches a maximum, the gain of the first automatic gain controlling amplifier is reduced. In the case of increasing the gain of the first and second automatic gain controlling amplifier, first the gain of the first automatic gain controlling amplifier is increased, and the gain of the second automatic gain controlling amplifier is increased when the gain of the first automatic gain controlling amplifier reaches the maximum value.

The gain control signal to the first automatic gain controlling amplifier 30 is set to have a comparatively long time constant and the gain control signal to the second automatic gain controlling amplifier 100 is set to have a comparatively short time constant. In the case where the signal level changes in a short period such as the case of flutter caused by aircraft or the like, the change is followed by the second automatic gain controlling amplifier 100.

The above-mentioned conventional receiving apparatus properly operates when receiving a television signal for which the received power between channels is approximately uniform. However, when broadcasting different transmission levels such as broadcasting by a standard television signal such as NTSC (National Television System Committee) broadcasting and a digitally transmitted high-definition television signal which are simultaneously frequency-division-multiplexed, such as the ATV (Advanced TV system in U.S.) and Perfect TV in Japan, it is difficult to remove a signal of an adjacent channel through the filter 20 and the filter 50, so that the signal of the adjacent channel is captured in the receiving apparatus together with the desired signal to be received. The desired signal captured together with the signal of the adjacent channel is then selected by the filter 90. This operation results because the frequencies of the signals when passing the filter 20 and the filter 50 are high and, currently, it is difficult to fabricate a filter having a sufficiently narrow pass band width for passing only the desired signal. Consequently, the desired signal to be received and the signal of the adjacent channel are processed together by each of the circuits before passing the filter 90 which may be SAW filter. Further, a problem occurs in that the NTSC signal of the adjacent channel is higher than the digital desired channel in level and therefore exceeds the dynamic range of each of the circuits in front of the filter 90, thereby possibly causing interference. Additionally, interference caused by the difference of received power between channels, as mentioned above, may also be caused when off-air TV signals are transmitted over a specific terrain or during a specific weather change.

SUMMARY OF THE INVENTION

It is an object of the present invention to provide an improved receiving apparatus having a capability of suppressing interference caused by a receiving signal exceeding the dynamic range of an amplifier.

It is another object of the present invention to provide an improved automatic gain controlling circuit suited for receiving a frequency-division-multiplexed signal.

It is still another object of the present invention to provide a receiving apparatus having a capability of suppressing the interference caused by capture of a signal of an adjacent channel when a frequency-division-multiplexed signal is received.

In accordance with the present invention, there is provided a television signal receiving apparatus and its automatic gain controlling circuit thereof including an input terminal for receiving a signal including first and second signal components creating interference, a first automatic gain controlling amplifier for amplifying the received signal and providing an amplified output signal, a filter for selectively passing a signal portion in a predetermined band of the amplified output signal from the first automatic gain controlling amplifier, a second automatic gain controlling amplifier for amplifying the signal portion passed by the filter and providing an amplified output signal portion, a switching signal generator responsive to one of the amplified output signal and the amplified output signal portion for generating a switching signal, a switching circuit at least being responsive to the switching signal for at least controlling supply of a gain control signal to the first and second automatic gain controlling amplifiers in accordance therewith, and an automatic gain control signal detector for detecting he amplified output signal for supplying an output indicative thereof to said switching circuit.

In accordance with a feature of the present invention, the switching signal generator is responsive to the amplified output signal from the first automatic gain controlling amplifier for generating the switching signal, the switching signal being variable over at least a predetermined range of values.

In accordance with another feature of the present invention, the switching signal generator is responsive to the amplified output signal portion from the automatic gain controlling amplifier for generating the switching signal, and the switching signal generator includes a demodulator for demodulating the amplified signal portion and for generating a signal indicative of noncompliance of the amplified signal portion with a demodulation format of the demodulator, and an arrangement for generating the switching signal in accordance with the signal of the demodulator.

These and other objects, features and advantages of the present invention will become more apparent from the following description when taken in conjunction with the accompanying drawings.

DESCRIPTION OF THE PREFERRED EMBODIMENTS

Figure 1:
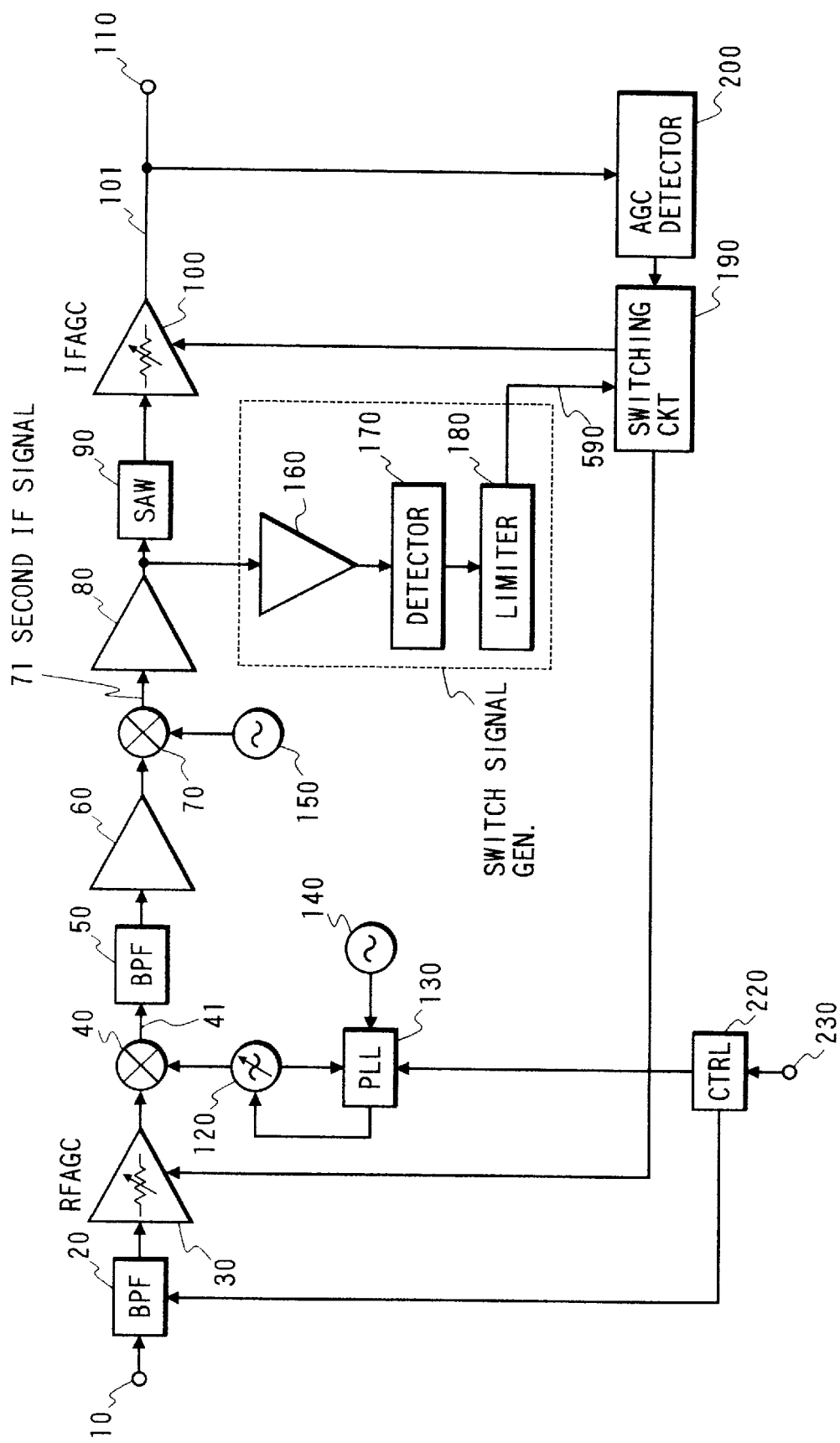
FIG. 1 is a block diagram illustrating a receiving apparatus in accordance with an embodiment of the present invention.

Referring now to the drawings, wherein like reference numerals are utilized to designate like parts throughout the several views, FIG. 1 shows a block diagram illustrating a high-definition television signal receiving apparatus according to an embodiment of the present invention. As shown in FIG. 1, a signal supplied to a television signal input terminal 10 is processed in an input filter 20 which is a band pass filter (BPF), the first automatic gain controlling (AGC) amplifier 30 which is an RF (radio frequency) AGC, a first mixer 40, a first IF (intermediate frequency) filter 50 (BPF), a first IF amplifier 60, a second mixer 70, a second IF amplifier 80, a second IF filter 90 which is a super acoustic wave (SAW) filter, and a second automatic gain controlling amplifier 100 (IFAGC) to be outputted from an output terminal 110. The first mixer 40 is connected with a first local oscillator 120. The first local oscillator 120 is connected with a reference oscillator 140 via a PLL (Phase Locked Loop) circuit 130. The second mixer 70 is connected with a second local oscillator 150.

The output signal of the second automatic gain controlling amplifier 100 is branched so as to be supplied to an AGC detector 200. The output signal of the second IF amplifier 80 is branched so as to be supplied to an amplifier 160, a detector 170, and a limiter 180 in this order. The output of the AGC detector 200 and the output of the limiter 180 are supplied to an AGC (Automatic Gain Control) signal switching circuit 190. The output of the AGC signal switching circuit 190 is supplied to the first automatic gain control amplifier 30 and the second automatic gain controlling amplifier 100. A channel selecting signal provided at a tuning signal input terminal 230 is supplied to a controller 220 and the output of the controller 220 is supplied to the PLL circuit 130 and to the input filter 20.

A high-definition television signal, which is digital information, is data-compressed, and multilevel digitally modulated by use of, for example, VSB (Vestigial Side-band modulation), QAM (Quadrature Amplitude Modification), QPSK (Quadraphase Shift Keying modulation), or OFDM (Orthogonal Frequency Division Multiplex). The modulated signal has the same band as the band width of a normal television signal. This high-definition television signal is transmitted on the NTSC signal and the off-air TV signal simultaneously through use of frequency division multiplexing, wherein the NTSC signal denotes a television signal based on NTSC. This signal is supplied from an antenna to the television signal input terminal 10 and divided by the input filter 20 into a VHF band (the VHF band may be further divided into low, middle, and high frequencies) and a UHF band. Only the band including the desired channel is selectively supplied to the first automatic gain controlling amplifier 30 based upon the output of the controller 220. The controller 220 controls the input filter 20 such that the passband of the input filter 20 becomes an appropriate passband based on the channel selecting signal provided at the tuning signal input terminal 230. By this input filter 20, the number of channels to be supplied to the first automatic gain control amplifier 30 can be reduced so as to reduce the mutual modulation interference and the like among the input signals to be caused in subsequent circuits. However, due to the characteristic of the filter 20, only the necessary channel cannot be outputted, and a signal of an adjacent channel is also outputted.

The first automatic gain controlling amplifier 30 amplifies the signal band-limited by the input filter 20 to an appropriate receive level, and supplies the resultant signal in the first mixer 40. The gain attenuation amount of the first automatic gain controlling amplifier 30 is set by the AGC signal supplied from the AGC signal switching circuit 190. The gain attenuation amount to be set will be described hereinafter.

The first local oscillator 120 is controlled by the controller 220 and the PLL circuit 130 so that oscillation is performed at a frequency corresponding to a desired channel by the channel selecting signal provided at the tuning signal input terminal 230. The PLL circuit 130 compares a signal obtained by dividing an oscillation frequency having a stable frequency from the reference oscillator 140 with a signal obtained by dividing an oscillation frequency from the first local oscillator 120 to control the oscillation frequency of the first local oscillator so that the error becomes zero. Appropriately varying these dividing ratios by the controller 220 allows the first local oscillator 120 to oscillate at a frequency corresponding to the desired channel. The first mixer 40 mixes the signal from the first automatic gain control amplifier 30 and the local oscillation signal from the first local oscillator 120 so as to output the first IF signal 41. The frequency of the first local oscillator 120 is set to a level above the upper-limit frequencies of the terrestrial transmission band of the NTSC television signal and the CATV transmission band in order to prevent the reception interference due to the leakage of the local oscillation signal from occurring. For example, for the frequency allocations in Japan and US, the frequency of the first local oscillator is set to 960 MHz band, 1200 MHz band, 1700 MHz band, 2600 MHz band, and 3000 MHz band.

The first IF filter 50 selectively passes the band including the desired channel of the first IF signal and supplies the passed signal to the first IF amplifier 60. The first IF filter 50 is a bandpass filter (a dielectric filter or a SAW filter) that has an in-band flatness characteristic and low-group delay deviation characteristic to such a degree as not to deteriorate the demodulation of the high-definition television signal. However, because the frequency is very high, it is difficult to pass only the desired channel and the signal of the adjacent channel also passes. The first IF amplifier 60 amplifies this signal and enters the amplified signal into the second mixer 70.

The second mixer 70 mixes the signal from the first IF amplifier 60 and the local oscillation signal from the second local oscillator 150 to output the second IF signal 71. The frequency of the second local oscillator 150 is set so that the frequency of the second IF signal 71 becomes the same as the frequency at the time of receiving the current standard television signal. More specifically, in the U.S., 44 MHz is set as the frequency at the time of receiving the NTSC signal. In Japan, the 57 Mhz band is utilized. The second IF signal 71 is amplified by the second IF amplifier 80. Because the frequency of the second IF signal 71 is low, the second IF filter 90 can use a filter that selectively passes only the desired channel and therefore the signal of the adjacent channel is first removed here. The second IF filter 90 requires an IF passband having a flat characteristic and a linear phase filter characteristic which do not deteriorate the demodulation characteristic of the high-definition television signal and, at the same time, passes only the tuned in signal channel, so that the second IF filter is constituted by a SAW filter or the like. The resultant signal is amplified or attenuated by the second automatic gain controlling amplifier 100 to a desired signal level and outputted from the output terminal 110. The signal outputted from the output terminal 110 is supplied, for example, to a synchronization detector (not shown).

If the NTSC signal which is higher in level than the high-definition television signal, which is the desired signal, is allocated on the channel adjacent to the desired signal or the channel next adjacent to the desired signal, this signal cannot be removed by filter 20 and the filter 50 as described above. Therefore, this signal is supplied from the signal input terminal 10 along with the desired signal. Consequently, if an NTSC signal having a large level is supplied along with the desired signal, the level of the sum signal of the desired signal and the NTSC signal possibly exceeds a dynamic range, in which an interference is caused in the circuit portion up to the second IF filter 90. Especially, if a SAW filter is used for the second IF filter 90, because the loss of the SAW filter is large and the signal level of the desired signal is set relatively high in the second mixer 70 and the second IF amplifier 80, if the NTSC signal on the adjacent channel is added, the possibility of departing from the dynamic range in a front stage of the circuit before the second filter 90 is higher, causing a large interference. That is if the channel adjacent the desired signal becomes larger, and exceeds the dynamic range in the front stage, the wave form of the desired signal, and some of the information included in the desired signal is lost. As the level of the NTSC signal gets larger, a larger interference is caused.

To suppress this interference, the signal supplied to in the second IF filter 90 is branched and amplified by the amplifier 160 and detected by the detector 170 which detects whether an NTSC signal having a large level of the adjacent channel has been supplied or not. That is, the detector 170 detects whether interference exists or not.

The AGC detector 200 receives the branched output signal of the second automatic gain controlling amplifier 100 and detects the resultant signal. The output of the detector 170 is supplied to the AGC signal switching circuit 190 via the limiter 180. At the same time, the output of the AGC detector 200 is supplied the AGC signal switching circuit 190.

The AGC signal switching circuit 190 operates generally in the same manner as the conventional double superheterodyne receiving apparatus if the output level of the detector 170 indicates that there is no interference. First, the output signal of the AGC detector 200 is applied as the gain control signal to the second automatic gain controlling amplifier 100 so that as the output of the AGC detector 200 increases, the gain attenuation amount increases. If the output of the AGC detector 200 does not drop when the gain attenuation amount of the second automatic gain controlling amplifier 100 reaches the maximum level, or a predetermined level, the AGC signal switching circuit 190 applies the output of the AGC detector 200 to the first automatic gain control amplifier 30 as the gain control signal.

According to the above-mentioned control operation, when the output of the AGC detector 200 lowers, the AGC signal switching circuit 190 initially applies the gain control signal to the first automatic gain control amplifier 30 such that the gain attenuation amount is reduced, thereby increasing the gain. When the gain of the first automatic gain controlling amplifier 30 has reached the maximum level, the gain is then controlled such that the gain attenuation amount of the second automatic gain controlling amplifier 100 lowers, thereby increasing the gain of the second automatic gain controlling amplifier 100.

The first automatic gain controlling amplifier 30 is set to have a comparatively long time constant and the gain control signal to the second automatic gain controlling amplifier 100 is set to have a comparatively short time constant. Thus, for the signal level change in a short period as with the flutter caused by aircraft or the like, the change can be followed by the second automatic gain controlling amplifier 100. The method of setting these time constants is well known in the automatic gain control of receiving apparatuses and therefore omitted from the description herein.

Further, if the output of the detector 170 is larger than a predetermined value and a circuit in front of the second IF filter 90 has interference, the AGC signal switching circuit 190 decreases the gain of the first automatic gain control amplifier 30 before the gain attenuation amount of the second automatic gain controlling amplifier reaches the maximum level. At this moment, the timing for decreasing the gain of the first automatic gain control amplifier 30 is determined according to the output of the detector 170. More specifically, if the interference is large, the gain of the first automatic gain controlling amplifier 30 is decreased before the gain attenuation amount of the second automatic gain controlling amplifier 100 reaches the maximum level; and if the interference is small, the gain of the first automatic gain control amplifier 30 is decreased when the attenuation amount of the second automatic gain controlling amplifier 100 nearly reaches the maximum level or a predetermined level. Namely, when there is an interference, the gain attenuation amount of the second automatic gain controlling amplifier 100 is increased according to the output of the second automatic gain controlling amplifier 100 and, the gain attenuation amount of the first automatic gain controlling amplifier 30 is increased in accordance with the level of the interference. As the interference gets larger, the gain attenuation amount of the first automatic gain control amplifier 30 is raised infinitely. When the input level is lowered, the CN (Carrier-to-Noise) ratio of the desired signal becomes insufficient. Further, as the interference becomes smaller, the gain attenuation amount of the first automatic gain controlling amplifier 30 is lowered infinitely; when the input level is raised, the dynamic range of the first automatic gain control amplifier 30 is exceeded. To prevent this from occurring, the limiter 180 specifies the upper and lower limits of the input level of the detector 170.

With the aforementioned circuit construction, the signal level supplied from the television signal input terminal 10 is made equivalently small, thereby preventing the signal level from exceeding the dynamic range in a circuit portion in front of the second IF filter 90 and therefore preventing the interference from occurring. In addition, because the gain attenuation amount of the second automatic gain controlling amplifier 100 increases or decreases according to the increase or decrease of the gain attenuation amount of the first automatic gain control amplifier 30, the output level of the desired signal outputted from the output terminal 100 can be kept constant regardless of the presence or absence of the interference.

If it is necessary to lower the gain of the first automatic gain controlling amplifier 30 or the second automatic gain controlling amplifier 100 to keep the signal level to be outputted from the output terminal 110 constant for reasons other than interference, the gain of the second automatic gain controlling amplifier 100 in the rear stage of the receiving apparatus is decreased as far as possible as in accordance with conventional practice. If this reduction is insufficient, the gain of the first automatic gain controlling amplifier 30 in the front stage can be kept as large as possible because the gain of the first automatic gain controlling amplifier 30 in the front stage has been decreased. Consequently, the degradation of the noise factor of the entire receiving apparatus can be suppressed.

The AGC signal switching circuit 190 and the limiter (or switching control signal generator) 180 which operate as described above are constructed as shown in FIG. 2. The limiter or switching control signal generator 180 includes a comparator 510, a PNP transistor 540, a variable resistor 550, a resistor 560, and a reference voltage source 570 connected in this order. The output of the detector 170 is supplied to the non-inverting input terminal of the comparator 510 and the inverting input terminal is connected with a reference voltage supply 500. The output terminal of the comparator 510 is connected to the base of the PNP transistor 540. The emitter of the PNP transistor 540 is connected with a power supply 580 and one end of the resistor 520. The other end of the resistor 520 is connected to the base of the PNP transistor 540. Between the variable resistor 550 and the resistor 560, an output signal line 590 is provided. The voltage of the reference voltage supply 500 is set such that the output of the comparator 510 becomes 0 when the output level of the detector 170 is a signal level at which the signal in front of the second IF filter 90 has no interference.

The AGC signal switching circuit 190 includes comparators 600 and 620 and a reference voltage supply 610. The inverting input terminal of the comparator 600 is connected to the reference voltage supply 610 and the non-inverting input terminal receives the output of the AGC detector 200. The output of the comparator 600 is supplied to the second automatic gain controlling amplifier 100 and is branched to be also supplied to the inverting input terminal of the comparator 620. The non-inverting input terminal of the comparator 620 is connected to the output signal line 590 of the limiter 180. The output of the comparator 620 is supplied to the first automatic gain control amplifier 30.

When the interference is small, the output level of the detector 170 is small, so that the output of the comparator 510 is small, thereby turning on the PNP transistor 540. When there is no interference, the output of the comparator 510 is 0. Letting the supply voltage be Vcc, the reference voltage 570 be VL, the resistance of the variable resistor 550 be VR, and the resistance of resistor 560 be R, then the non-inverting input voltage Vcont from the output signal line 590 of the limiter or switching control signal generator 180 to the comparator 620 is:

$$Vcont = (Vcc - VL) \times \left(\frac{R}{R + VR}\right) + VL \quad (1)$$

As the interference gets larger, the PNP transistor 540 is turned off. When the interference exceeds a certain level, $$Vcont = VL \quad (2)$$

Also, according to the magnitude of the interference, Vcont takes a value between those given by relations (1) and (2). Thus, the value of Vcont varies according to the magnitude of the interference. Also, the maximum value of Vcont is expressed in the relation (1) while the minimum value is expressed in the relation (2). The value of Vcont falls between these maximum and minimum values. Therefore, the limiter or switching control signal generator 180 functions as a limiter which outputs a signal having upper and lower limits based on the output of the detector 170. As seen from the above-mentioned relations, the limiter or switching control signal generator 180 is constructed so that Vcont takes a smaller value as the interference gets larger.

The AGC switching circuit 190 compares the output of the AGC detector 200 with the voltage of the reference voltage supply 610 in the comparator 600. If the output of the AGC detector 200 is larger than the voltage of the reference voltage supply 610, the AGC circuit supplies the gain control signal to the second automatic gain controlling amplifier 100 according to the output of the AGC detector 200. Namely, if the output of the second automatic gain controlling amplifier 100 is large, the gain controlling signal having a large level is applied to the second automatic gain controlling amplifier 100. Because the second automatic gain controlling amplifier 100 has a polarity in which the gain attenuation amount becomes larger as the level of the gain control signal becomes larger, the second automatic gain controlling amplifier 100 is set to a larger gain attenuation amount as its own output level becomes larger.

The gain control signal outputted from the comparator 600 is branched so as to also be supplied to the inverting input terminal of the comparator 620. The gain control signal is supplied to the inverting input terminal of the comparator 620 because the polarity of the first automatic gain controlling amplifier 30 is an opposite polarity with respect to the polarity of the second automatic gain controlling amplifier 100. The comparator 620 compares the gain control signal with the output Vcont of the limiter or switching control signal generator 180. As described above, Vcont corresponds to the magnitude of the interference of the circuit portion in front of the filter 90. If the gain control signal is larger than Vcont, the comparator 620 outputs the gain control signal to the first automatic gain controlling amplifier 30 to increase the gain attenuation amount of the first automatic gain controlling amplifier 30. If there is no interference, the Vcc, VL, R, and VR of the limiter or switching control signal generator 180 are set in advance such that the level of Vcont=(Vcc−VL)R/(R+VR)+VL at the time no interference exists becomes the same as the level of the comparator 600 for setting the gain attenuation amount of the second automatic gain controlling amplifier 100 to the maximum level(or a predetermined level), in order to prevent the gain control signal from being outputted to the first automatic gain control amplifier 30 until the gain attenuation amount of the second automatic gain controlling amplifier 100 reaches the maximum level(or a predetermined level).

With the aforementioned construction, as the signal level of the output signal of the second automatic gain controlling amplifier 100 increases, the gain control signal from the AGC switching circuit 190 is applied to the second automatic gain controlling amplifier 100 when Vcont takes a value indicated by the relation (1) (there is no interference) while the gain control signal is applied to the first automatic gain controlling amplifier 30 when the gain attenuation amount of the second automatic gain controlling amplifier 100 has reached the maximum level (or a predetermined level). When Vcont takes a value other than indicated by the relation (1) (there is an interference), the gain control signal is applied to the first automatic gain controlling amplifier 30 before the gain attenuation amount of the second automatic gain controlling amplifier 100 reaches the maximum level (or a predetermined level) according to the magnitude of the interference when the signal level of the output signal of the second automatic gain controlling amplifier 100 increases.

Thus, by detecting the signal level in front of the second IF filter 90 by the detector 170, the existence of interference caused by the adjacent channel having a level higher than the signal level of the channel to be received can be detected when the signal level is large. By supplying the signal corresponding to the interference level detected by the detector 170 to the comparator 620 which outputs the gain control signal to the first automatic gain controlling amplifier 30, the gain of the first automatic gain controlling amplifier 30 can be attenuated according to the magnitude of the interference. Therefore, the interference that is caused by the signal from the adjacent channel having a level higher than the level of the channel to be received can be reduced effectively. Thus, if a signal having a large level of NTSC broadcasting exists on the channel adjacent to the channel of high-definition television broadcasting based on digital transmission and the NTSC signal is supplied from the adjacent channel along with the desired signal, the NTSC signal is attenuated by the first automatic gain controlling amplifier 30, thereby reducing the interference because there is no possibility that the dynamic range of the circuit portion in front of the filter 90 is not exceeded. This allows high-definition television broadcasting to be received with low error rate.

In addition, Vcont takes a value between those given by the relations (1) and (2) according to the magnitude of the interference, so that not only the interference can be suppressed, but also a reduction of CN ratio can be minimized. Further, if there is no interference, reducing the gain of the second automatic gain controlling amplifier 100 as far as possible can reduce the noise factor of the receiving apparatus as in the conventional manner, because the output signal level is maintained. Thus, the high-definition television receiving apparatus utilizing the above described automatic gain controlling circuit can prevent the interference caused by the NTSC signal on the adjacent channel from occurring, effectively reduce the noise factor of the receiving apparatus, and constantly maintain the output level of the desired signal to be received and outputted from the output terminal 100 regardless of the presence or absence of interference, thereby receiving the desired channel at a stable level.

In the above-described embodiment, the upper and lower limits of Vcont are provided by the limiter or switching control signal generator 180, so that, even if the interference becomes large, the gain attenuation amount of the first automatic gain control amplifier 30 is not increased infinitely so as to lower the input signal level too greatly. Consequently, the CN ratio of the desired signal can be obtained. In addition, if the interference becomes small, there is no possibility that the gain attenuation amount of the first automatic gain control amplifier 30 is lowered infinitely so as to make the input exceed the dynamic range of the first automatic gain control amplifier 30. Thus, the receiving apparatus having stable operations can be provided. The receiving apparatus of this embodiment not only can suppress the interference coming from the adjacent channel as described above, but also is suitable for receiving a television signal modulated with different CN ratio than the required CN ratio.

Figure 2:
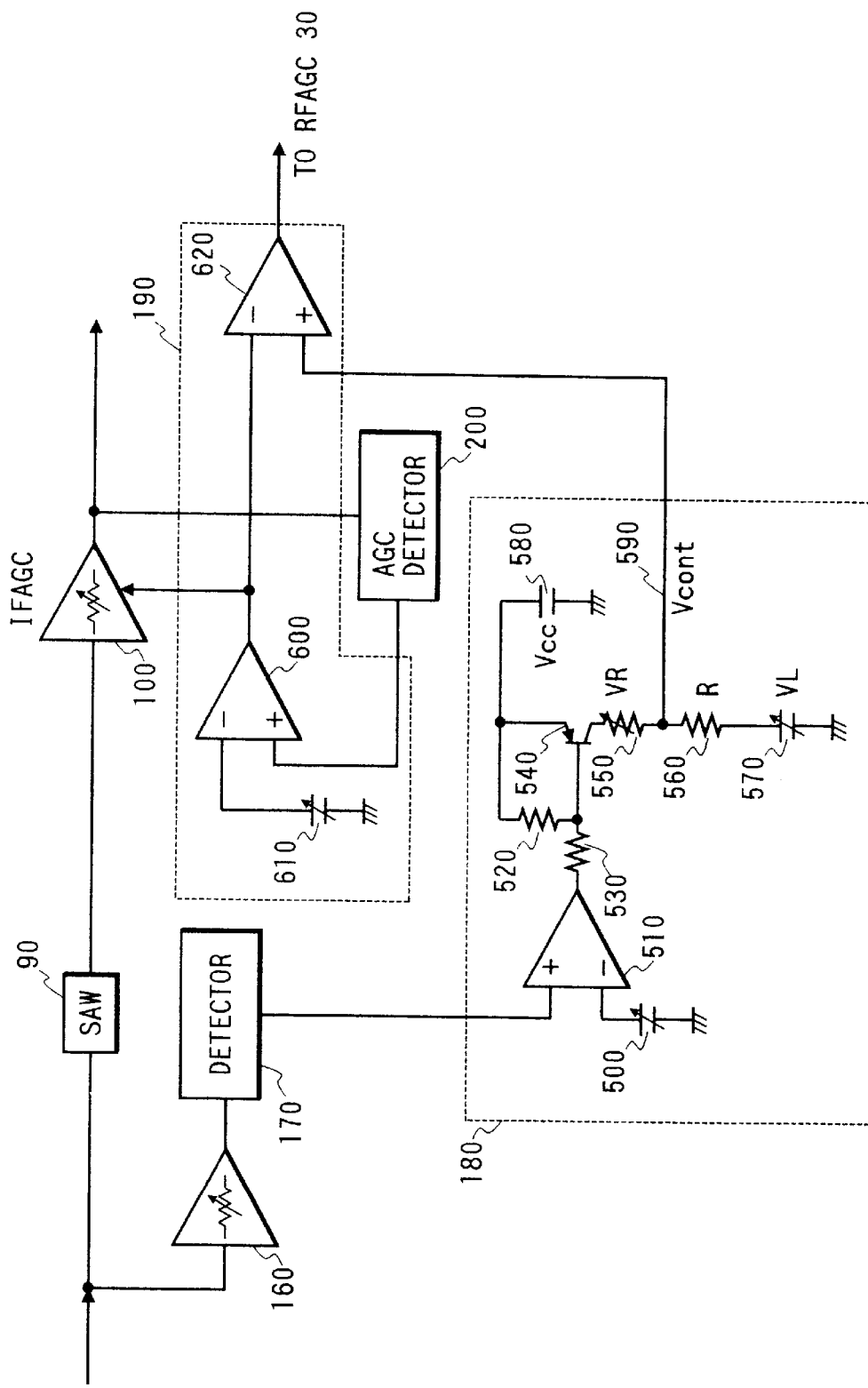
FIG. 2 is a circuit diagram illustrating a detailed construction of the AGC signal switching circuit and the limiter of FIG. 1.
Figure 3:
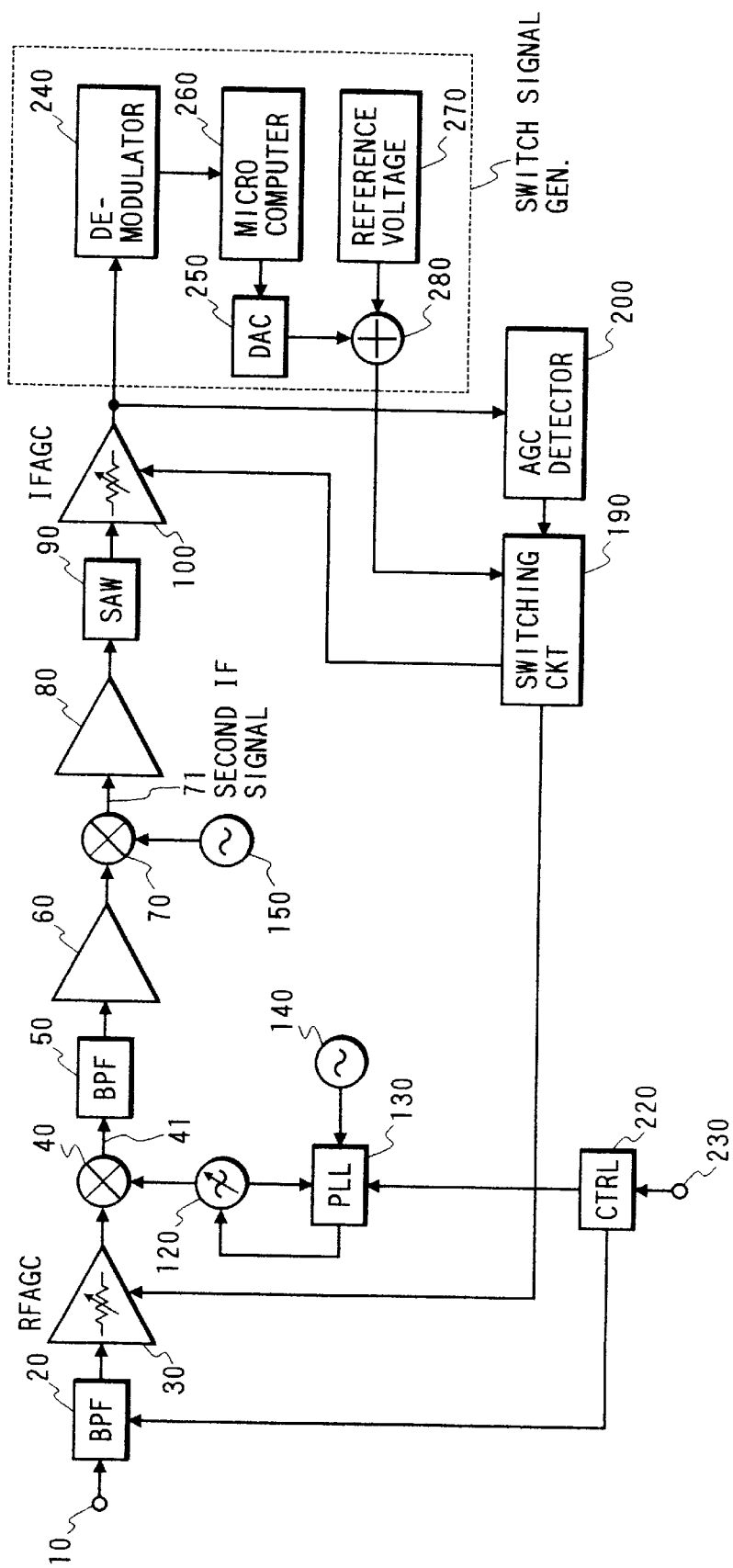
FIG. 3 is a block diagram illustrating a receiving apparatus in accordance with another embodiment of the present invention.

FIG. 3 illustrates a high-definition television signal receiving apparatus according to another embodiment of the present invention and differs from the receiving apparatus of FIG. 1 in that the output of the second IF amplifier 80 is not detected, but rather a signal having a level equivalent to Vcont of FIGS. 1 and 2 is generated digitally, and the generated digital signal is converted to an analog signal supplied to the AGC signal switching circuit 190. The demodulator 240 generates a signal in digital form when it is no longer possible to perform demodulation. From the signal, a scanning signal of the level of Vcont between the levels expressed by the relations (1) and (2) is generated by using a microcomputer 260 and a digital-to-analog converter (DAL) 250. The digital-to-analog converter 250 converts the scanned signal to an analog signal and supplies the analog signal to the non-inverting input terminal of the comparator 620 in the AGC signal switching circuit 190, as explained in the following.

Figure 4:
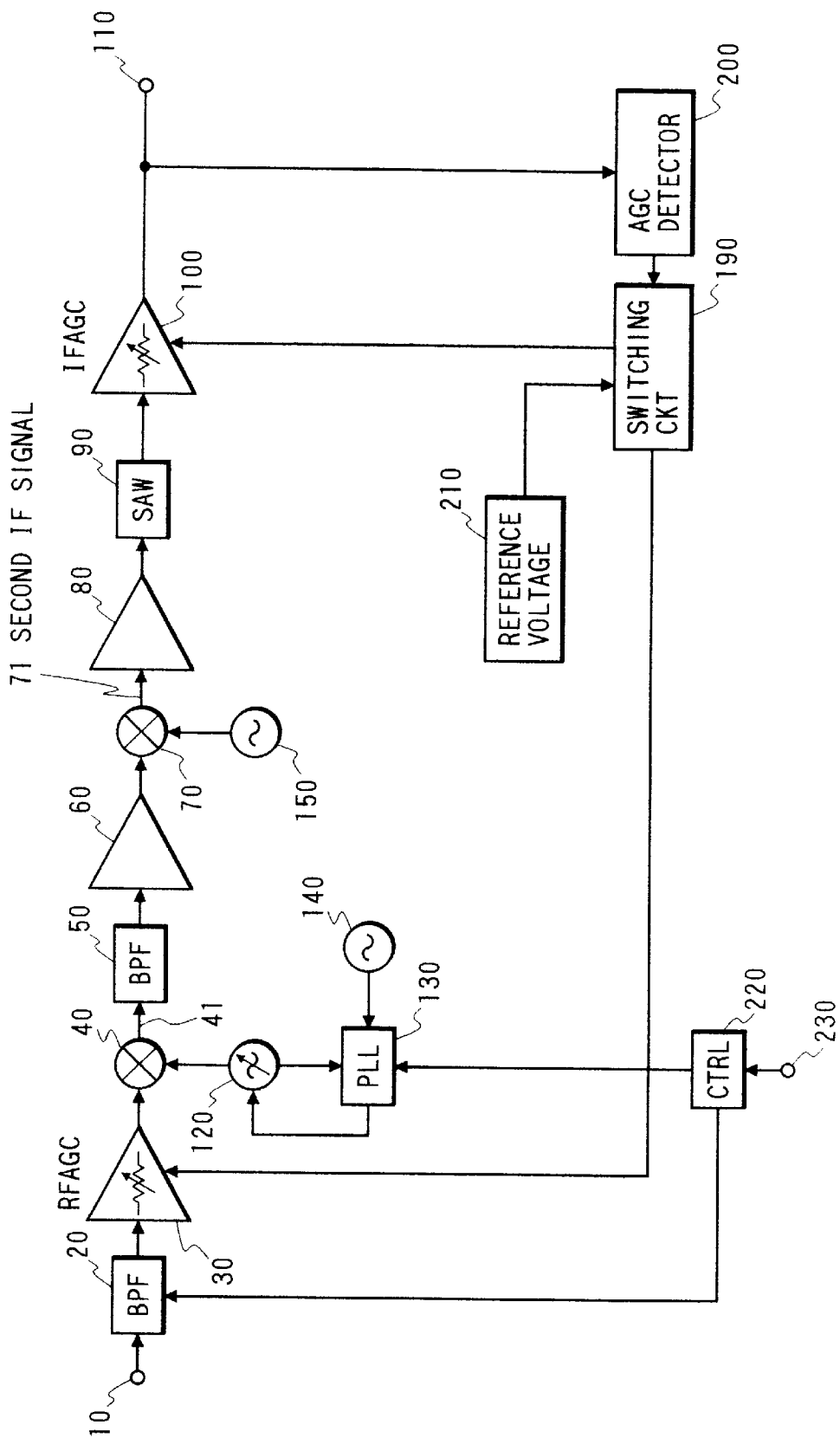
FIG. 4 is a block diagram illustrating a conventional receiving apparatus.

The output signal of the second automatic gain controlling amplifier 100 is supplied to the demodulator 240 in which the output signal is converted from an analog signal to a digital signal and processed in a digital filter having cosine roll off characteristics. The signal is further processed for waveform equalization, carrier recovery, and in-band flatness correction. If the signal cannot be demodulated, in that a demodulation format of the demodulator 240 is not complied with so that carrier recovery is not made, for example, a signal indicative thereof is generated by the demodulator 240 and supplied to the microcomputer 260. Although in FIG. 4, the microcomputer 260 is shown separately from the demodulator 240 from the view point of convenience, it is apparent that a microcomputer incorporating a demodulator may be utilized. A signal indicating that the carrier recovery is not made is supplied to the microcomputer 260 and the microcomputer 260 generates a saw-tooth wave in digital form. The output signal of the microcomputer 260 is supplied to the digital-analog converter 250 for outputting a saw-tooth signal. The saw-tooth signal is added to a reference voltage 270 in an adder 280 and supplied as a signal equivalent to Vcont to the AGC signal switching circuit 190. The saw-tooth signal is, for example, supplied to the non-inverting input terminal of the comparator 620 in FIG. 2.

When a disturbance wave is mixed into the demodulator 240, and carrier recovery cannot be effected, the saw-tooth signal is supplied to the non-inverting input terminal of the comparator 620 and the switching point of the gain controlling from the second automatic gain controlling amplifier 100 to the first automatic gain controlling amplifier 30 is changed so that interference caused by exceeding the dynamic range in the front stage of the filter 90 and distorting of the television signal is reduced so that carrier recovery can be effected.

If an NTSC signal having a level larger than that of the desired signal is allocated on the channel adjacent to the high-definition television signal, which is the desired signal, or the channel next to the adjacent channel, then an interference is caused in the receiving apparatus, thereby disabling demodulation through the high-definition television signal demodulator 240. Demodulation disability is caused by many other factors and therefore it is difficult for the demodulator to detect only this interference. However, if the demodulation disability is caused by this interference, scanning Vcont when the demodulation is disabled enables the demodulation when Vcont takes some value. Therefore, the high-definition television signal demodulator 240 is constituted such that Vcont is first scanned when the demodulation is disabled. If the demodulation still cannot be performed, it can be assumed that the demodulation disability has been caused by a factor other than the interference and other forms for solving the demodulation disability are effected.

It is apparent that it is also possible to vary the Vcont range by the required CN ratio of the received signal in FIG. 3. Further, in FIG. 3, the analog detector and limiter of FIG. 1 are not required and the incorporation thereof in the demodulator IC is possible, thereby reducing the number of parts. Although the embodiments have been described in connection with a receiving apparatuses using double superheterodyne, it is apparent to those skilled in the art that the present invention is applicable to a receiving apparatus using single superheterodyne.

As mentioned above and according to the invention, there is provided an television signal receiving apparatus and an automatic gain controlling circuit thereof which can extract only a desired signal from a sum signal with two or more signals having different levels frequency-division-multiplexed and process the extracted signal with interference suppressed. The apparatus according to the invention is usable in a high-definition television receiving apparatus having a capability of suppressing the interference caused in the receiving apparatus when broadcasting of different transmission levels such as broadcasting based on standard television signal such as NTSC broadcasting of different transmission levels and high-definition television signal broadcasting based on digital transmission are frequency-division-multiplexed simultaneously or caused by the difference in receive power between channels caused by a specific terrain or weather condition at the transmission by terrestrial wave.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An automatic gain controlling circuit comprising:
    an input terminal for receiving a signal including first and second signal components creating interference;
    a first automatic gain controlling amplifier for amplifying the received signal and providing an amplified output signal;
    a filter for selectively passing a signal portion in a predetermined band of the amplified output signal from said first automatic gain controlling amplifier;
    a second automatic gain controlling amplifier for amplifying the signal portion passed by said filter and providing an amplified output signal portion;
    a switching signal generator responsive to one of the amplified output signal and the amplified output signal portion for generating a switching signal;
    a switching circuit at least being responsive to the switching signal for at least controlling supply of a gain control signal to said first and second automatic gain controlling amplifiers in accordance therewith; and
    an automatic gain control signal detector for detecting the amplified output signal for supplying an output indicative thereof to said switching circuit.

2. An automatic gain controlling circuit according to claim 1, wherein said switching circuit controls the gain of said first and second automatic gain controlling amplifiers in accordance with the amplified output signal portion from said second automatic gain controlling amplifier, wherein if the gains of said first and second automatic gain controlling amplifiers are decreased in accordance with the amplified output signal portion, said switching circuit switches the gain controlling from said second automatic gain controlling amplifier to said first automatic gain controlling amplifier when attenuation of said second automatic gain controlling amplifier attains a predetermined value, and wherein if the gains of said first and second automatic gain controlling amplifiers are increased, said switching circuit switches the gain controlling from said first automatic gain controlling amplifier to said second automatic gain controlling amplifier when the gain of said first automatic gain controlling amplifier attains a predetermined value.

3. An automatic gain controlling circuit according to claim 1, wherein said switching signal generator is responsive to the amplified output signal from said first automatic gain controlling amplifier for generating the switching signal.

4. An automatic gain controlling circuit according to claim 3, wherein the switching signal is variable over at least a predetermined range of values.

5. An automatic gain controlling circuit according to claim 3, wherein said switching circuit is responsive to said switching signal generator when the amplified output signal is smaller than a predetermined value for switching gain controlling from said second automatic gain controlling amplifier to said first automatic gain controlling amplifier at a point in which gain attenuation of said second automatic gain controlling amplifier attains a predetermined level, and said switching circuit is responsive to the amplified output signal being larger than the predetermined level for switching the gain controlling from said second automatic gain controlling amplifier to said first automatic gain controlling amplifier at a point corresponding to the signal level of the amplified output signal.

6. An automatic gain controlling circuit according to claim 3, wherein said switching signal generator includes:
    a detector for detecting the amplified output signal which is inputted to said filter; and
    a switching signal generating circuit for generating the switching signal in response to an output signal from said detector when the output signal of said detector becomes larger than a predetermined value;
    said switching circuit including a first gain setting part for setting the gain of said second automatic gain controlling amplifier in accordance with the output from said automatic gain control signal detector; and
    a second gain setting part for setting the gain of said first automatic gain controlling amplifier according to a difference between the output of said automatic gain control signal detector and the switching signal of said switching signal generator.

7. An automatic gain controlling circuit according to claim 6, wherein said switching signal generator further comprises a comparator for outputting a signal corresponding to the output of said detector when the output of said second detector exceeds a predetermined value, and an active element responsive to the output signal of said comparator for changing an operating condition thereof in accordance with the output signal from said comparator.

8. An automatic gain controlling circuit according to claim 6, wherein said first gain setting part includes a comparator having a first terminal connected to a reference source, a second terminal connected to said automatic gain control signal detector, and an output terminal connected to said second automatic gain controlling amplifier.

9. An automatic gain controlling circuit according to claim 6, wherein said second gain setting part includes a comparator having a first input terminal connected to the output terminal of said first gain setting part, a second input terminal connected to an output of said switching signal generator, and an output terminal connected to said first automatic gain controlling amplifier.

10. An automatic gain controlling circuit according to claim 1, wherein said automatic gain controlling circuit forms part of a television signal receiving apparatus, and further comprising a frequency converting part for changing a frequency of the amplified output signal from said first automatic gain controlling amplifier, said filter selectively passing a signal portion in a predetermined band of the frequency changed amplified output signal in the predetermined band of a selected station indicated by a tuning signal.

11. An automatic gain controlling circuit according to claim 10, wherein said frequency converting part includes a first frequency changing part for changing the frequency of the output of said first automatic gain controlling amplifier to a first intermediate frequency, and a second frequency changing circuit for changing the first intermediate frequency signal changed by said first frequency changing circuit into a second intermediate frequency.

12. An automatic gain controlling circuit according to claim 3, wherein said automatic gain controlling circuit forms part of a television signal receiving apparatus, and further comprising a frequency converting part for changing a frequency of the amplified output signal from said first automatic gain controlling amplifier, said filter selectively passing a signal portion in a predetermined band of the frequency changed amplified output signal in the predetermined band of a selected station indicated by a tuning signal.

13. An automatic gain controlling circuit according to claim 12, wherein said frequency converting part includes a first frequency changing part for changing the frequency of the output of said first automatic gain controlling amplifier to a first intermediate frequency, and a second frequency changing circuit for changing the first intermediate frequency signal changed by said first frequency changing circuit into a second intermediate frequency.

14. An automatic gain controlling circuit according to claim 1, wherein said switching signal generator is responsive to the amplified output signal portion from said automatic gain controlling amplifier for generating the switching signal, said switching signal generator including a demodulator for demodulating the amplified signal portion and for generating a signal indicative of noncompliance of the amplified signal portion with a demodulation format of the demodulator, and means for generating the switching signal in accordance with the signal of the demodulator.

15. An automatic gain controlling circuit comprising:

an input terminal for receiving a signal including first and second signal components creating interference;

a first automatic gain controlling amplifier for amplifying the received signal and providing an amplified output signal;

a filter for selectively passing a signal portion in a predetermined band of the amplified output signal from said first automatic gain controlling amplifier;

a second automatic gain controlling amplifier for amplifying the signal portion passed by said filter and providing an amplified output signal portion;

a switching signal generator responsive to one of the amplified output signal and the amplified output signal portion for generating a switching signal;

a switching circuit at least being responsive to the switching signal for at least controlling supply of a gain control signal to said first and second automatic gain controlling amplifiers in accordance therewith; and an automatic gain control signal detector for detecting the amplified output signal for supplying an output indicative thereof to said switching circuit;

wherein said switching signal generator is responsive to the amplified output signal portion from said automatic gain controlling amplifier for generating the switching signal, said switching signal generator including a demodulator for demodulating the amplified signal portion and for generating a signal indicative of noncompliance of the amplified signal portion with a demodulation format of the demodulator, and means for generating the switching signal in accordance with the signal of the demodulator; and wherein said means for generating the switching signal in accordance with the signal of the demodulator includes a microcomputer responsive to the signal of the demodulator for generating a digital signal, a digital-to-analog converter for converting the digital signal to an analog saw-tooth signal, said switching circuit being responsive to the saw-tooth signal for switching a point of gain control between said first and second automatic gain controlling amplifiers in accordance therewith.

16. An automatic gain controlling circuit according to claim 15, wherein said means for generating the switching signal further includes an adder for adding the saw-tooth signal and a reference signal, and for supplying the added signal to the switching circuit.

17. An automatic gain controlling circuit according to claim 14, wherein said automatic gain controlling circuit forms part of a television signal receiving apparatus, and further comprising a frequency converting part for changing a frequency of the amplified output signal from said first automatic gain controlling amplifier, said filter selectively passing a signal portion in a predetermined band of the frequency changed amplified output signal in the predetermined band of a selected station indicated by a tuning signal.

18. An automatic gain controlling circuit according to claim 17, wherein said frequency converting part includes a first frequency changing part for changing the frequency of the output of said first automatic gain controlling amplifier to a first intermediate frequency, and a second frequency changing circuit for changing the first intermediate frequency signal changed by said first frequency changing circuit into a second intermediate frequency.

19. A television signal receiving apparatus comprising:

an input terminal for receiving a signal including first and second signal components creating interference;

a first automatic gain controlling amplifier for amplifying the received signal and providing an amplified output signal;

a frequency converting part for changing a frequency of the amplified output signal from said first automatic gain controlling amplifier;

a filter for selectively passing a signal portion in a predetermined band of the frequency changed amplified output signal in the predetermined band of a selected station indicated by a tuning signal;

a second automatic gain controlling amplifier for amplifying the signal portion passed by said filter and providing an amplified output signal portion;

a switching signal generator responsive to one of the amplified output signal and the amplified output signal portion for generating a switching signal;

a switching circuit at least being responsive to the switching signal for at least controlling supply of a gain control signal to said first and second automatic gain controlling amplifiers in accordance therewith; and an automatic gain control signal detector for detecting the amplified output signal for supplying an output indicative thereof to the switching circuit.

20. A television signal apparatus according to claim 19, wherein said frequency converting part includes a first frequency changing part for changing the frequency of the output of said first automatic gain controlling amplifier to a first intermediate frequency, and a second frequency changing circuit for changing the first intermediate frequency signal changed by said first frequency changing circuit into a second intermediate frequency.

* * * * *